United States Patent [19]

Peters

[11] 4,371,587
[45] Feb. 1, 1983

[54] LOW TEMPERATURE PROCESS FOR DEPOSITING OXIDE LAYERS BY PHOTOCHEMICAL VAPOR DEPOSITION

[75] Inventor: John W. Peters, Malibu, Calif.

[73] Assignee: Hughes Aircraft Company, Culver City, Calif.

[21] Appl. No.: 247,571

[22] Filed: Mar. 26, 1981

Related U.S. Application Data

[63] Continuation of Ser. No. 104,323, Dec. 17, 1979, abandoned.

[51] Int. Cl.³ .................... B32B 9/04; B32B 13/04
[52] U.S. Cl. ..................... 428/446; 204/157.1 R; 427/53.1; 427/54.1; 427/82; 427/93; 427/248.1; 427/255; 427/255.3; 428/450; 428/457; 428/469; 428/699; 428/701
[58] Field of Search .............. 427/53.1, 54.1, 82, 427/85, 86, 87, 91, 93, 95, 248.1, 99, 255, 162, 255.3; 118/715, 725, 728, 50.1, 620; 204/157.1 R; 428/446, 469, 699, 701, 457, 450

[56] References Cited

U.S. PATENT DOCUMENTS

| | | | |
|---|---|---|---|
| 2,968,530 | 1/1961 | Forgeng et al. | 106/55 |
| 3,117,838 | 1/1964 | Sterling et al. | 423/335 |
| 3,496,037 | 2/1970 | Jackson et al. | 148/175 |
| 3,620,827 | 5/1967 | Collet | 427/54.1 |
| 3,632,433 | 1/1972 | Tokuyama | 427/93 |
| 3,637,434 | 1/1972 | Nakanuma et al. | 148/175 |
| 3,650,929 | 3/1972 | Lertes | 204/164 |
| 3,698,948 | 10/1972 | Barone et al. | 427/95 |
| 3,907,616 | 9/1975 | Wiemer | 427/95 |
| 4,001,762 | 1/1977 | Aoki et al. | 427/93 |
| 4,002,512 | 1/1977 | Lim | 427/93 |
| 4,098,923 | 7/1978 | Alberti et al. | 427/95 |
| 4,100,310 | 7/1978 | Ura et al. | 427/95 |
| 4,181,751 | 1/1980 | Hall et al. | 427/53.1 |
| 4,194,021 | 3/1980 | Messick | 427/95 |
| 4,232,057 | 11/1980 | Ray et al. | 427/39 |

FOREIGN PATENT DOCUMENTS

| | | | |
|---|---|---|---|
| 38-19828 | 9/1963 | Japan | 204/157.1 R |
| 38-21456 | 10/1963 | Japan | 204/157.1 R |
| 42-12408 | 7/1967 | Japan | 427/95 |
| 51-54770 | 5/1976 | Japan | 427/54.1 |

OTHER PUBLICATIONS

Collet, "Depositing Silicon Nitride Layers at Low Temperature Using a Photochemical Reaction," J. Electrochem. Soc. pp. 110-111, Jan. 1969.
H. J. Emeleus and K. Stewart, "Effect of Light on the Ignition of Monosilane-Oxygen Mixtures," Transactions of the Faraday Society, vol. 32, 1936, pp. 1577-1584.
R. J. Cvetanovic, "Mercury Photosensitized Decomposition of Nitrous Oxide," Journal of Chemical Physics, vol. 23, No. 7, Jul. 1955, pp. 1203-1207.

Primary Examiner—S. L. Childs
Attorney, Agent, or Firm—Mary E. Lachman; William J. Bethurum; A. W. Karambelas

[57] ABSTRACT

The specification discloses a low temperature process for depositing oxide layers on a substrate by photochemical vapor deposition, by exposing the substrate to a selected vapor phase reactant in the presence of photochemically generated neutral (un-ionized) oxygen atoms. The oxygen atoms react with the vapor phase reactant to form the desired oxide, which deposits as a layer on the substrate. The use of photochemically generated neutral oxygen atoms avoids damage to the substrate due to charge bombardment or radiation bombardment of the substrate. The deposited oxide layer may optionally incorporate a selected dopant material in order to modify the physical, electrical, or optical characteristics of the oxide layer.

39 Claims, 2 Drawing Figures

LOW TEMPERATURE PROCESS FOR DEPOSITING OXIDE LAYERS BY PHOTOCHEMICAL VAPOR DEPOSITION

This is a continuation of application Ser. No. 104,323, filed Dec. 17, 1979 now abandoned.

TECHNICAL FIELD

This invention relates generally to the manufacture of semiconductor devices and, more particularly, to a photochemical vapor deposition process for forming a dielectric oxide layer on the surface of a selected semiconductor material or an optical substrate, using a low temperature and non-ionizing radiation.

BACKGROUND ART

In the manufacture of semiconductor devices, it is frequently necessary to form a dielectric layer either as a passivation layer to permanently protect the surface of the substrate or as a mask during such procedures as etching, solid state diffusion, or ion-implantation. One method by which an oxide layer, such as silicon dioxide ($SiO_2$), may be formed is a plasma-enhanced chemical vapor deposition process as described by James A. Amick, G. L. Schnable, and J. L. Vossen, in the publication entitled, "Deposition Techniques for Dielectric Films on Semiconductor Devices," in the *Journal of Vacuum Science Technology*, Vol. 14, No. 5, September–October 1977, pp. 1053–1063. In such a plasma-enhanced process, the vapor phase reactants, such as silane ($SiH_4$) and nitrous oxide ($N_2O$), are subjected to a radio frequency discharge, which creates an ionized plasma of the reactant gases. These ionized reactants then interact to form the desired reaction product. However, as a result of the exposure of the reactant gases to the radio frequency discharge, numerous extraneous ionized and neutral particles, as well as high energy radiation with wavelengths as low as 500 angstroms (Å) and even extending into the x-ray region, are produced and bombard the surface of the substrate on which the oxide is being formed. If the substrate comprises a sensitive device type, such as a charge coupled device or a device formed of certain compound semiconductors (e.g., InSb, HgCdTe, or GaAs), the above-described charged particles and unwanted radiation frequently impart damage to these sensitive devices. For example, the deposited oxide layer may incorporate charges or dangling bonds, which create high surface state densities ($N_{ss}$) at the semiconductor device/oxide layer interface and which will trap charges when a voltage is applied to the device, thereby preventing optimum device performance. In addition, a plasma enhanced deposition process has the disadvantage that plasma-induced heating of the substrate occurs as a result of selective absorption of the radio frequency energy by the substrate, and this heating causes uncertainty in the temperature of the substrate, which prevents optimization of the characteristics of the deposited oxide layer.

Other methods by which oxide layers may be formed use a non-reactive or a reactive sputtering technique. By a non-reactive sputtering technique, as described, for example, by Amick et al as referenced above, a disk of the selected oxide material, such as $SiO_2$, is bombarded with argon ions, which cause the $SiO_2$ to vaporize, and the vaporized $SiO_2$ subsequently deposits on the selected substrate. By a reactive sputtering technique, as described, for example, by Amick et al as referenced above, a disk of silicon is bombarded with oxygen ions, which causes vaporization of the silicon, and the vaporized silicon and oxygen ions then react to produce the desired $SiO_2$. However, these sputtering techniques are similar to the above-described plasma processes in that they frequently impart damage to sensitive devices due to charge bombardment or radiation bombardment of the device. In addition, the films produced by sputtering techniques are often granular, not dense, and not specular (i.e., having good light reflecting properties).

Both the sputtering technique and the plasma-enhanced method for chemical vapor deposition may be used to deposit a dielectric layer which incorporates a selected dopant material. In the former case, an appropriately doped target could be bombarded by selected ions. In the latter case, a dopant-containing material is added to the reactant gases which are then ionized. However, both the above sputtering technique and the above plasma-enhanced method suffer from the difficulties discussed above, particularly that of imparting damage due to charge bombardment or radiation bombardment and plasma-induced heating of the substrate.

Still another known method by which oxide layers may be formed involves thermal processes. In order to form $SiO_2$, for example, by a thermal process, silane is brought into contact with oxygen at a low temperature and a spontaneous reaction occurs, forming $SiO_2$. The films formed by thermal processes, however, are usually granular, do not necessarily have good adhesion, and tend to incorporate traps.

It is the alleviation of the prior art problem of imparting damage to sensitive devices due to charge bombardment or radiation bombardment during the formation of an oxide layer thereon to which the present invention is directed.

SUMMARY OF THE INVENTION

The general purpose of this invention is to provide a new and improved process for depositing a layer of an oxide of a chosen material on the surface of a selected substrate by low-temperature photochemical vapor deposition. This process possesses most, if not all, of the advantages of the above prior art oxide deposition processes, while overcoming their above-mentioned significant disadvantages.

The above general purpose of this invention is accomplished by exposing the substrate to a selected vapor phase reactant in the presence of photochemically generated, neutral (un-ionized) oxygen atoms. The oxygen atoms react with the vapor phase reactant to form the desired oxide, which deposits as a layer on the substrate. The use of photochemically generated neutral oxygen atoms avoids damage to the substrate due to charge bombardment or radiation bombardment.

Accordingly, it is an object of the present invention to provide a new and improved process for depositing a layer of an oxide of a chosen material on the surface of a selected substrate by a novel, low-temperature chemical vapor deposition process which avoids damage to the substrate from charge- or radiation-bombardment.

Another object of the present invention is to provide a process of the type described which minimizes the value of the surface state density at the oxide/semiconductor substrate interface and thus minimizes the charge traps in the deposited oxide layer.

Still another object is to provide a process of the type described which produces a low density of generation/- recombination centers at the interface between the deposited oxide layer and the substrate, and thus provides good minority carrier lifetime in the substrate and reduced susceptibility to radiation damage in the device formed by this process.

Another object is to provide a process of the type described which is performed at a temperature as low as room temperature (e.g. 30° C.) and thus eliminates the problems of boundary migration and the resulting decreased device yields which are encountered in the fabrication of high density/high speed devices at higher temperatures.

Yet another object of the present invention is to provide a process of the type described which produces dense, non-granular, adherent oxide films on selected substrates.

Another object of the present invention is to provide a new and improved process for depositing a layer of a chosen oxide containing a selected dopant material on the surface of a substrate by a chemical vapor deposition process which avoids damage to the substrate due to charge bombardment or radiation bombardment.

Still another object is to provide a new and improved process for depositing a layer of a chosen oxide containing a selected dopant material on the surface of a substrate, which uses a photochemical technique.

The foregoing and other objects, features, and advantages of the present invention will be apparent from the following more particular description of the preferred embodiments of the invention, as illustrated in the accompanying drawings.

DETAILED DESCRIPTION OF THE INVENTION

Figure 1:
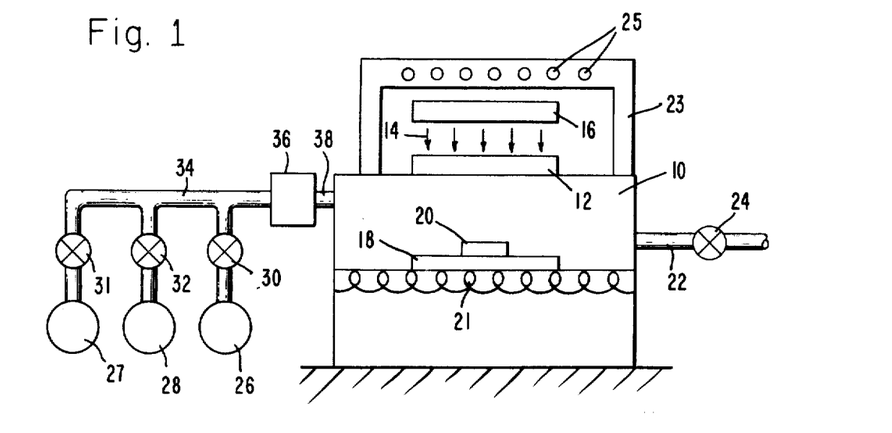
FIG. 1 illustrates, in schematic form, a preferred apparatus for carrying out the processes according to first and second embodiments of the present invention, in which neutral oxygen atoms are formed by the mercury photosensitized dissociation of an oxygen-containing precursor and are reacted to form an undoped or a doped oxide layer, respectively.

FIG. 1 shows, in simplified form, an apparatus suitable for implementation of two process embodiments of the present invention in which neutral oxygen atoms are formed by the mercury photosensitized dissociation of a chemically unreactive oxygen-containing precursor, such as nitrous oxide ($N_2O$), molecular oxygen ($O_2$), or nitrogen dioxide ($NO_2$). (The term "chemically unreactive" is used herein to denote that a substance will not react with the designated reactants under normal mixture conditions.) A reaction chamber 10, in which the chemical vapor deposition reaction occurs, is provided with a quartz window 12, which is integral with the top surface of the reaction chamber 10. The quartz window 12 is transmissive to the selected wavelength of radiation used to initiate the desired photochemical reaction to be discussed below, and this radiation 14 of a selected wavelength is produced by the radiation-producing means 16, which may be, for example, an array of low pressure mercury vapor arc lamps. Within the reaction chamber 10, there is a substrate holder 18, which receives a substrate 20 onto which the desired oxide layer is to be deposited.

External to the reaction chamber 10 and adjacent to the bottom surface thereof, there are heating elements 21, which may be formed, for example, of Nichrome wire and are activated by applying a controlled voltage thereto. The heating elements 21 may be used optionally to heat the substrate 20 to the required temperature so that appropriate properties of the deposited layer, such as density, may be obtained. The temperature in the chamber 10 may be maintained as low as room temperature (i.e. 30° C.) or as high as required (e.g., 300° C. or higher). However, since mercury vapor arc lamps, for example, become less efficient at increased temperatures, it is necessary to provide external water cooling or an external air or nitrogen cooling source to cool these lamps and remove radiant heat produced by the substrate 20 and substrate holder 18 at certain elevated temperatures (as high as 600° C., for example, or higher). For this purpose, the radiation-producing means 16 is completely contained within the enclosure 23, which may be formed of aluminum, and an external cooling means 25, such as pipes with water flowing therethrough as shown in FIG. 1 or flowing nitrogen gas, is activated to apply cooling to the enclosure 23. The enclosure 23 is secured to the outside surface of the reaction chamber 10 which surrounds the quartz window 12, but may be removed therefrom as required. Thus, the processing temperature is maintained at a level such that sufficient cooling of the mercury lamps can be accomplished in order to provide efficient lamp performance. The enclosure 23 also provides eye protection to the operator from the radiation 14. Leading from the reaction chamber 10, there is a tube 22 which passes through a valve 24 and then to a vacuum-producing means, such as a pump, (not shown), which is used to evacuate the chamber 10 to a sufficiently low pressure to allow the vapor deposition reaction to occur.

External to the reaction chamber 10, there are chambers 26 and 28 which contain the individual reactant gases for the selected chemical vapor deposition reaction, for example, silane and nitrous oxide. The chambers 26 and 28 are connected to control valves or flowmeters 30 and 32, respectively, which are used to control the amounts of reactants which are introduced into a tube 34. Alternatively, for a second process embodiment of the present invention (discussed below), there are included a third chamber 27, which contains the precursor of the selected dopant material, such as phosphine, and a corresponding control valve or flowmeter 31, which controls the amount of dopant precursor introduced from the chamber 27 into the tube 34, where it is mixed with the other reactant gases discussed above.

The reactant gases flow through the tube 34 into a chamber 36 which contains a pool of mercury (at room temperature) having mercury vapor above it, at a vapor pressure of $10^{-3}$ Torr (millimeters of mercury) at 30° C. The reactant gases thus become mixed with mercury vapor in the chamber 36 and this reactant gas mixture then passes through a tube 38 and into the reaction chamber 10, where the chemical vapor deposition reaction may be brought about. The components of the apparatus shown in FIG. 1 may be constructed of stainless steel or aluminum, unless otherwise specified. The apparatus shown in FIG. 1 may be used for either a low pressure continuous flow photochemical reactor system, in which there is a continuous influx of reactant gases and removal of reaction by-products during the photochemical reaction process, or for a static photochemical reactor system, in which specified amounts of reactants are introduced into the reaction chamber, the flow of reactant gases is stopped, and then the photochemical reaction process is allowed to occur.

In practicing the present invention in accordance with the first embodiment thereof, which depends on the photochemical generation of atomic oxygen, and using the apparatus of FIG. 1 with only two reactant gas chambers (chambers 26 and 28), a chemical vapor deposition process is performed as generally described by Werner Kern and Richard S. Rosler in the publication entitled, "Advances in Deposition Processes for Passivation Films", in the *Journal of Vacuum Science Technology*, Vol. 14, No. 5, September–October 1977, pp. 1082-1099, in the discussion of low pressure chemical vapor deposition processes. The reaction chamber 10 is evacuated by the vacuum-producing means to a predetermined pressure, for example 1 to 4 Torr (millimeter mercury). The selected vapor phase reactant, such as SiH$_4$, is placed in a chamber such as the chamber 26, and a chemically unreactive oxygen-containing precursor, such as N$_2$O, is placed in a chamber such as the chamber 28. The valves 30 and 32 are set so that the reactants from the chambers 26 and 28, respectively, in a predetermined ratio and at a predetermined flow rate may pass into the tube 34 and then into the chamber 36, which contains a pool of mercury. These reactant gases become mixed with mercury vapor in the chamber 36 and pass from the chamber 36 through the tube 38 into the reaction chamber 10, which is maintained at approximately room temperature (e.g. 30° C.) or up to 200° C. or higher. The radiation-producing means 16 is activated and produces the radiation 14 of a selected wavelength required to produce the desired photochemical reaction (e.g. 2537 Å to produce mercury in an excited state). The radiation 14 passes through the quartz window 12 into the reaction chamber 10, where it excites the mercury (Hg) atoms in the reactant gas mixture to form mercury atoms in an excited state (Hg*) (approximately 5 electron volts above normal ground state, but unionized), as shown in Equation (1) below. The Hg* then collides with the oxygen-containing precursor, such as N$_2$O, and causes the precursor to dissociate and produce atomic oxygen (O), as shown in Equation (2a) below.

In addition, the Hg* may react with the selected vapor phase reactant, such as SiH$_4$, to produce a reactive radical, such as .SiH$_3$, as shown in equation (2b) below. Finally, the atomic oxygen reacts with the reactant, SiH$_4$, or the reactive radical, such as .SiH$_3$, to produce the desired oxide, such as SiO and SiO$_2$, as shown in Equations (3a) and (3b) below. Either SiO or SiO$_2$ can be produced, depending on the reactant gas ratio of SiH$_4$ and N$_2$O (i.e. the steady state concentration of atomic oxygen which oxidizes SiH$_4$).

where h = Planck's constant
v = frequency of absorbed radiation (1)

(2a)

(2b)

(3a)

(3b)

The reaction of Hg* with SiH$_4$ to form the radical .SiH$_3$ is a side reaction which is not necessary to the process of the present invention, but leads to the same end product as the major reaction path. The atomic oxygen produced in Equation (2a) above may react directly with the selected vapor phase reactant without first forming an intermediate radical, as described in Equation (3a) above.

Alternatively, the atomic oxygen required for this first process embodiment of the present invention may be formed by the mercury sensitized dissociation of nitrogen dioxide (NO$_2$) to form atomic oxygen and NO. Further, atomic oxygen may also be formed by the mercury sensitized dissociation of molecular oxygen in accordance with Equations (4) and (5) below, or by other known means for forming atomic oxygen by photochemical processes.

(4)

(5)

Since molecular oxygen reacts spontaneously with SiH$_4$ as discussed in relation to the prior art thermal oxidation process, it is necessary to inhibit this spontaneous thermal oxidation process in order to permit the formation of atomic oxygen and the reaction thereof with SiH$_4$ in accordance with the process of the present invention. This inhibition is accomplished by carefully controlling the operating pressure and the ratio of reactant gases, as discussed in more detail in Example 3 below. By controlling such process parameters the thermal oxidation process may be completely inhibited and the oxidation process of the present invention may occur without any competing processes.

By the above-described process of the present invention, oxygen atoms are produced by a photochemical process which generates only neutral particles. Thus, the prior art problems associated with the generation of charged particles and high energy radiation which bombard the substrate have been avoided. The value of the surface state density (N$_{ss}$) at the oxide/semiconductor substrate interface and thus the charge traps in the oxide or insulator layer are minimized by the process of the present invention. In addition, a low density of generation/recombination centers (i.e., dangling bonds or traps) is produced at the interface between the deposited oxide and the substrate and thus good minority carrier lifetime in the substrate is achieved in devices formed by the process of the present invention. In addition, the process of the present invention provides enhanced protection against device damage due to radiation (i.e. from a cobalt-60 source) by minimizing the creation of dangling bonds and traps during the deposition of the oxide or insulator layer. These traps and dangling bonds normally increase the probability of radiation damage to the device and their minimization thus reduces the probability of radiation damage. Further, the problem of boundary migration has been eliminated since the process of the present invention can be conducted at a relatively low temperature, i.e. as low as room temperature, and the associated problem of decreased device yield encountered in the high temperature fabrication of high density devices such as very large scale integrated circuits and very high speed integrated circuits, has been avoided. In addition, the prior art problem of plasma-induced heating is avoided by the process of the present invention since selective absorption of radiation by the substrate does not occur in the process described herein. Furthermore, the process of the present invention is free of particulate formation, for example, on chamber walls, which is a problem often encountered in the prior art processes discussed above. Finally, the oxide layer formed by the process of the present invention is dense, non-granular, scratch-resistant, specular, has negligible porosity, and is strongly adherent to a variety of surfaces, such as semiconductor, metal and inorganic surfaces. Such oxide layers find utility both as a passivation layer and as a gate insulator layer in integrated circuit devices. Furthermore, these oxide layers may be used as a conformal coating on integrated circuits and hybrid microcircuits. In addition, these oxide layers may be used in the fabrication of HgCdTe photoconductive and photovoltaic devices. This first process embodiment of the present invention and the related third process embodiment discussed below are, to my knowledge, the first demonstration of the use of a photochemical process for the deposition of a dielectric oxide layer on a substrate.

Using the above-described process, the present invention may also be used to oxidize trimethyl aluminum, $(CH_3)_3Al$, to $Al_2O_3$; trimethyl gallium, $(CH_3)_3Ga$, to $Ga_2O_3$; germane, $GeH_4$, to $GeO_2$; diborane, $B_2H_6$, to $B_2O_3$; trimethyl indium, $(CH_3)_3In$ to $In_2O_3$; titanium tetrachloride, $TiCl_4$, to $TiO_2$; tungsten hexafluoride, $WF_6$, to $W_2O_3$, and hafnium hydride, $HfH_4$, to $HfO_2$. This first process embodiment of the present invention is illustrated in Example 1 below.

Furthermore, a process carried out in accordance with a second embodiment of the present invention may be performed by practicing the present invention as described above, using the apparatus of FIG. 1 with three (3) reactant gas chambers (chambers 26, 27, and 28), to deposit on the surface of a chosen substrate an oxide layer which incorporates a selected dopant material in order to modify the physical, electrical, or optical characteristics of the oxide layer. To accomplish this second process embodiment of the present invention, the selected vapor phase reactant, such as $SiH_4$, is exposed to simultaneously formed and photochemically generated neutral oxygen atoms and neutral atoms or atomic fragments of the selected dopant, such as phosphorus-containing phosphinyl radicals. The neutral atomic particles are produced by the mercury photosensitized dissociation of a chemically unreactive oxygen-containing precursor, such as nitrous oxide ($N_2O$) and a chemically unreactive dopant-containing precursor, such as phosphine ($PH_3$), which results in the generation of atomic oxygen and neutral phosphinyl radicals, respectively, as shown in Equations (6) through (8) below. The atomic oxygen and phosphinyl radicals subsequently oxidize the $SiH_4$ to phosphorus-doped silicon dioxide $[Si(P)O_2]$, as shown in Equation (9) below.

$$Hg + h\nu(2537 \text{ Å}) \rightarrow Hg^* \tag{6}$$

$$Hg^* + N_2O \rightarrow N_2 + O + Hg \tag{7}$$

$$Hg^* + PH_3 \rightarrow .PH_2 + H. + Hg \tag{8}$$

$$SiH_4 + O + .PH_2 \rightarrow Si(P)O_2 + H_2O \tag{9}$$

A mechanistic alternative to the sequence described above involves the simultaneous oxidation of both $SiH_4$ and $PH_3$ by atomic oxygen, as indicated in Equations (10) through (12) below. Thus, atomic oxygen alone may be sufficient to bring about the desired reaction as shown in Equation (12) below. Consequently, the production of neutral particles of the selected dopant material as described above in Equation (8) may not be necessary in practicing the second process embodiment of this invention, but may occur.

$$Hg + h\nu(2537 \text{ Å}) \rightarrow Hg^* \tag{10}$$

$$Hg^* + N_2O \rightarrow N_2 + O + Hg \tag{11}$$

$$SiH_4 + PH_3 + O \rightarrow Si(P)O_2 + H_2O \tag{12}$$

The procedure followed to accomplish this second process embodiment of the invention is essentially as described above with respect to the first process embodiment of the present invention, except that additionally, a controlled amount of a selected dopant-containing precursor is introduced from the chamber 27 through the control valve 31 into the tube 34, where it mixes with the reactant gases from the chambers 26 and 28.

Thus, by this second process embodiment of the present invention, a doped dielectric film may be deposited by a low-temperature process which avoids the generation of charged particles and high energy radiation and their consequent bombardment damage to the substrate. Additionally, this embodiment has all the advantages enumerated above with respect to the formation of an undoped dielectric layer by the process of the present invention. This second process embodiment of the present invention and the related fourth process embodiment discussed below are, to my knowledge, the first demonstration of the use of a photochemical process for the deposition of a doped dielectric layer.

By the process according to this second embodiment of the present invention, other dopants besides phosphorus may be incorporated in the deposited dielectric layer by addition of the corresponding dopant-containing precursor to the reactant gas mixture. For example, diborane ($B_2H_6$) may be used for boron doping, arsine ($AsH_3$) may be used for arsenic doping, stibine ($SbH_3$) may be used for antimony doping, hydrogen selenide ($H_2Se$) may be used for selenium doping, hydrogen sulfide ($H_2S$) may be used for sulfur doping, or hydrogen telluride ($H_2Te$) may be used for tellurium doping. Other dopant-containing precursors which are capable of the mercury photosensitized dissociation reaction of the type discussed herein may also be used. Other dielectric films besides $SiO_2$ may be formed, as discussed above. This second process embodiment of the present invention is illustrated in more detail in Example 2 below.

Figure 2:
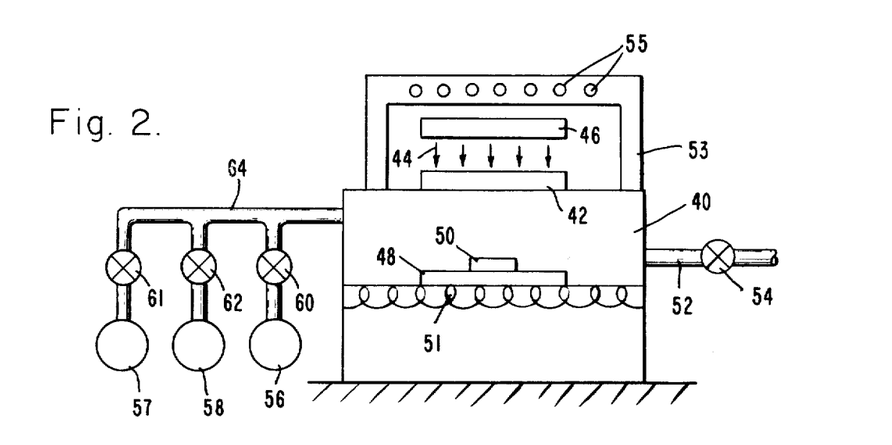
FIG. 2 illustrates, in schematic form, a preferred apparatus for carrying out the processes according to third and fourth embodiments of the present invention, in which neutral oxygen atoms are formed by the direct dissociation of an oxygen-containing precursor and are reacted to form an undoped or a doped oxide layer, respectively.

Turning now to FIG. 2, there is shown an apparatus suitable for implementation of the processes according to of third and fourth embodiments of the present inven- tion, in which neutral oxygen atoms are formed by a direct photochemical reaction of an oxygen-containing precursor, thus eliminating the requirement of mercury photosensitization. A reaction chamber 40 in which the photochemical vapor deposition reaction occurs is provided with a transparent window 42, which is integral with the top surface of the chamber 40. The material of which the window 42 is formed is chosen to be transparent to the selected wavelength of radiation which will be used for the photochemical reaction. Radiation 44 having a selected wavelength is produced by a radiation-producing means 46, such as an array of low pressure mercury vapor arc lamps, and passes through the window 42 into the chamber 40. Within the reaction chamber 40, there is a substrate holder 48, which holds a substrate 50 onto which the desired oxide layer is to be deposited. External to the reaction chamber 40 at the bottom surface thereof, there are heating elements 51, which may be formed of Nichrome wire and are activated by application of a controlled voltage thereto. The heating elements 51 may be used optionally to preheat the substrate 50 to the required temperature for forming a deposited layer with desired properties.

In practicing the present invention, the temperature in the chamber 40 may be maintained as low as room temperature or as high as 200° C. or higher. In order to provide the required cooling of the radiation-producing means 46, as previously discussed in relation to FIG. 1, radiation-producing means 46 is completely enclosed within the enclosure 53, which may be formed of aluminum, and an external cooling means 55, such as pipes with water flowing therethrough as shown in FIG. 2 or flowing nitrogen gas, is activated to apply cooling to the enclosure 53. The enclosure 53 performs the additional function of eliminating the formation of ozone which would occur if the radiation 44 (such as 1849 Å radiation) were allowed to contact molecular oxygen in the open atmosphere, which would cause the formation of atomic oxygen that would then react with additional molecular oxygen in the atmosphere to form ozone. The enclosure 53 is secured to the outside surface of the reaction chamber 40 which surrounds the quartz window 42, but may be removed therefrom as required.

Leading from the reaction chamber 40, there is a tube 52 which passes through a valve 54 and then to a vacuum producing means, e.g., a vacuum pump, (not shown) which is used to evacuate the chamber 40 to a sufficiently low pressure (e.g., 1-4 Torr) to allow the vapor deposition reaction to occur.

External to the reaction chamber 40, there are chambers 56 and 58, which contain the individual selected reactant gases, such as silane ($SiH_4$) and nitrous oxide ($N_2O$), respectively, for producing the desired photochemical reaction. The chambers 56 and 58 are connected to control valves or flowmeters 60 and 62, respectively, which are used to control the amounts of reactants which are introduced into a tube 64. Alternatively, in accordance with a fourth process embodiment of the present invention (discussed below), there are included a third chamber 57, which contains the precursor of the selected dopant material, such as phosphine, and a corresponding control valve or flowmeter 61, which controls the amount of dopant precursor introduced from the chamber 57 into the tube 64, where it is mixed with the other reactant gases discussed above. The reactant gases flow through the tube 64 into the reaction chamber 40, where the photochemical reaction may be brought about. The components of the apparatus shown in FIG. 2 may be constructed of stainless steel or aluminum, unless otherwise specified. The apparatus shown in FIG. 2 may be used for either a continuous flow photochemical reactor system or a static photochemical reactor system, as discussed above with reference to FIG. 1.

In practicing the present invention in accordance with the third embodiment thereof and using the apparatus of FIG. 2, the general process described in relation to the first process embodiment of FIG. 1 is followed, except that no mercury is used for photosensitization. The valves 60 and 62 are set so that the reactant gases, such as $SiH_4$ and $N_2O$, from the chambers 56 and 58, respectively, pass in a predetermined ratio and at a predetermined flow rate into the tube 64 and then into the reaction chamber 40. The radiation-producing means 46 is activated and produces the radiation 44 of a selected wavelength, which is the appropriate wavelength to cause the direct dissociation of the selected oxygen-containing precursor (e.g. 1750-1950 Å for $N_2O$). The radiation 44 passes through the window 42, which is formed of a material that is transparent to the wavelength of the radiation 44. The radiation 44 passes into the reaction chamber 40, where it causes the dissociation of the selected oxygen-containing precursor, such as $N_2O$, into atomic oxygen, which then reacts with the selected vapor phase reactant, such as $SiH_4$, to form the desired oxide, such as $SiO_2$ and $SiO$, as shown in Equations (13) and (14) below.

$$N_2O + h\nu(1849\text{Å}) \longrightarrow O + N_2 \quad (13)$$

$$SiH_4 + O \longrightarrow \begin{cases} SiO_2 + H_2O \\ SiO + H_2O \end{cases} \quad (14)$$

Alternatively, the atomic oxygen required for this third process embodiment of the present invention may be formed by the direct photochemical dissociation of molecular oxygen as shown in Equation (15) below or of nitrogen dioxide ($NO_2$) as shown in Equation (16) below or of similar known materials which are capable of dissociation to oxygen by a direct photochemical process.

$$O_2 + h\nu(1849\text{ Å}) \rightarrow 2O \quad (15)$$

$$NO_2 + h\nu(3500-6000\text{ Å}) \rightarrow O + NO \quad (16)$$

When molecular oxygen is used as the source of atomic oxygen, the operating pressure and reactant gas ratio must be carefully controlled in order to inhibit the spontaneous thermal oxidation of the $SiH_4$ by the $O_2$, as previously discussed in relation to an alternative process embodiment of the present invention and as illustrated in Example 3 below.

By the above-described process in accordance with this third embodiment of the present invention, oxygen atoms are generated by a photochemical process which produces only neutral particles. Thus, the previously discussed prior art problems caused by the generation of charged particles and high energy radiation and their bombardment of the substrate have been avoided. The advantages of this third process embodiment of the present invention are the same as those discussed in relation to the first process embodiment described with respect to FIG. 1. In addition, the process according to this third embodiment has the advantage that no photosensitizing mercury is necessary, and thus possible mercury contamination of the deposited oxide can be avoided. Further, the apparatus for carrying out the process according to this third embodiment is less complex than an apparatus requiring the use of mercury.

Using the above-described process, the present invention may also be used to deposit dielectric oxides of gallium, germanium, boron, and indium and metal oxides of aluminum, tungsten, titanium, and hafnium, using the gas phase reactants discussed in relation to FIG. 1. This third process embodiment of the present invention is illustrated in Example 3 below.

Furthermore, a process carried out in accordance with a fourth embodiment of the present invention may be performed by practicing the present invention as described above, but also using the apparatus of FIG. 2 with three (3) reactant gas chambers (chambers 56, 57, and 58), to deposit an oxide layer which incorporates a selected dopant material, on the surface of a chosen substrate. To accomplish this fourth process embodiment of the present invention, the selected vapor phase reactant, such as SiH$_4$, is exposed to photochemically generated neutral oxygen atoms in the presence of a dopant-containing precursor, such as phosphine (PH$_3$). The neutral atomic oxygen is produced by direct dissociation of an oxygen-containing precursor, such as N$_2$O, by radiation of a selected wavelength as shown in Equation (17) below. The atomic oxygen then simultaneously oxidizes the SiH$_4$ and PH$_3$ to form the desired phosphorus-doped SiO$_2$ as shown in Equation (18) below.

$$N_2O + h\nu(1849 \text{ Å}) \rightarrow O + N_2 \quad (17)$$

$$SiH_4 + PH_3 + O \rightarrow Si(P)O_2 + H_2O \quad (18)$$

A possible alternative to the above-described sequence involves the direct dissociation of the dopant-containing precursor such as phosphine to form a neutral phosphinyl radical as shown in Equation (19) below. The phosphinyl radical so formed and the atomic oxygen formed in accordance with the direct dissociation reaction of Equation (17) above then react with the silane reactant to form the desired phosphorus-doped SiO$_2$ as shown in Equation (20) below.

$$PH_3 + h\nu(1849 \text{ Å}) \rightarrow PH_2 + H. \quad (19)$$

$$SiH_4 + O + .PH_2 \rightarrow Si(P)O_2 + H_2O \quad (20)$$

The procedure followed to accomplish the process according to the fourth embodiment of this invention is essentially as described above with respect to the third process embodiment of the present invention, except that additionally a controlled amount of a selected dopant-containing precursor, such as phosphine gas, is introduced from the chamber 57 and through the valve 61 into the tube 64, where it mixes with the reactant gases from the chambers 56 and 58.

Thus, by this fourth process embodiment of the present invention, a doped dielectric film may be deposited by a low-temperature process which avoids the generation of charged particles and high energy radiation and their consequent bombardment damage to the substrate and additionally avoids the use of mercury for photosensitization. The significance of these advantages has been discussed above with respect to the third process embodiment of the present invention. Various dopant materials other than phosphine may be used, and the materials include diborane, arsine, stibine, hydrogen selenide, hydrogen sulfide, hydrogen telluride, or other dopant-containing precursors which are capable of simultaneous oxidation by atomic oxygen with the selected gas phase reactant to form the desired doped oxide layer. This fourth process embodiment of the present invention is illustrated in Example 4 below.

EXAMPLE 1

This example illustrates the use of the process according to the first embodiment of the present invention as previously described herein.

Using the apparatus described and illustrated in relation to FIG. 1 with two reactant gas chambers, SiO and SiO$_2$ were independently deposited on the surface of a wafer of silicon having a two-inch diameter. Nitrous oxide was used as the oxygen-containing precursor and silane was the selected vapor phase reactant. The reaction chamber 10 was evacuated by the vacuum-producing means to a pressure of 10$^{-3}$ Torr, then back-filled with nitrogen, and again evacuated to a pressure of 10$^{-3}$ Torr. The flowmeters 30 and 32 were activated to admit the reactant gases (SiH$_4$ and N$_2$O) in a predetermined ratio into the tube 34 and subsequently into the chamber 36 and the reaction chamber 10, and the reactant gas flow rates were stabilized. The operating pressure within the reaction chamber 10 was adjusted by means of the valve 24 to achieve a pressure of approximately 1 Torr. The heating elements 21 and the cooling means 25 were activated. Finally, the low pressure mercury arc resonance lamps were activated and emitted radiation at 2537 Å, which was absorbed by the mercury vapor in the reaction chamber, producing photo-excited mercury atoms, which collided with the nitrous oxide to form atomic oxygen. The atomic oxygen then oxidized the silane to either SiO$_2$ or SiO. When using a continuous flow photochemical reactor system at an operating pressure of 2 Torr, with a reactant gas flow rates of 2 standard cubic centimeters per minute (sccm) of SiH$_4$ and 50 sccm of N$_2$O, a layer of SiO$_2$ was produced. When reactant gas flow rates of 2 sccm of SiH$_4$ and 10 sccm of N$_2$O were used in a continuous flow system, layer of SiO was produced. At a substrate temperature of 100° C., the silicon oxide layer was deposited are the rate of 200 Å per minute using a continuous flow system. When using a static photochemical reactor system with a reactant gas pressures of SiH$_4$ and N$_2$O equivalent to 3 millimeters (mm) and 12 mm of mercury, respectively, silicon monoxide (SiO) was produced as a layer on the surface of the silicon wafer. When reactant gas pressures of SiH$_4$ and N$_2$O equivalent to 3.0 mm to 30 mm of mercury, respectively, were used in a static system, silicon dioxide (SiO$_2$) was produced as the layer on the silicon wafer.

The refractive index of the photodeposited silicon oxide layers formed by the process of this embodiment of the present invention was determined by ellipsometry as a function of the reactant gas mixture ratio, N$_2$O/SiH$_4$. Mixtures rich in N$_2$O (i.e. atomic oxygen) produced films with a refractive index characteristic of SiO$_2$, i.e. 1.45. Mixtures of N$_2$O/SiH$_4$ progressively leaner in N$_2$O yielded silicon oxide films with less oxygen content and, ultimately, SiO with a refractive index of 1.88. The etch rate characteristics of the photodeposited SiO$_2$ material in buffered HF were comparable to those of SiO$_2$ films deposited by low temperature plasma techniques. The stoichiometric composition of the film was determined by Auger electron spectroscopy. The $SiO_2$ films exhibited an excellent composition/depth profile and stoichiometrically were equivalent to pure $SiO_2$. The SiO films exhibited slower etch rates than the $SiO_2$ films due to the depleted oxygen content of the SiO films, which was confirmed by Auger spectroscopic analysis. The breakdown voltage of the $SiO_2$ films formed by the process of the present invention was determined to be $3.0 \times 10^6$ volts/centimeter, the dielectric constant was approximately 5.5, and the dissipation factor was $1.5 \times 10^{-2}$, which measurements are comparable to the values obtained for similar films formed by a prior art thermal process previously discussed. The density of the $SiO_2$ films formed by the process of the present invention was 2.3 grams/cubic centimeter.

The photochemically deposited $SiO_2$ layers formed by the above-described process of the present invention have application as dielectric layers for the passivation of semiconductor devices, particularly charge-sensitive microelectronic devices, such as silicon MOS devices, HgCdTe photoconductive and photovoltaic devices, and GaAs field-effect transistors. These layers may be deposited to a typical thickness of 1200–1500 Å for such a purpose. In addition, the process of the present invention may be used to deposit an anti-reflective oxide coating on a lens, including a plastic lens, or a solar cell, or to deposit a protective oxide coating on a mirror.

Using the above-described process, $SiO_2$ layers were similarly deposited on Ge, InSb, and Al substrates.

EXAMPLE 2

This example illustrates the use of the process according to the second embodiment of the present invention as previously described herein.

Using the apparatus described and illustrated in relation to FIG. 1 with three reactant gas chambers, a layer of phosphorus-doped $SiO_2$ was deposited on the surface of a silicon wafer having a two-inch diameter. The general procedure described in relation to Example 1 above was followed, with the addition of a third reactant gas. Nitrous oxide was used as the oxygen-containing precursor, silane was the selected vapor phase reactant, the phosphine was the phosphorus dopant-containing precursor. The process was initiated by the photochemical excitation of mercury vapor at $10^{-3}$ Torr in a quartz reaction chamber. Low pressure mercury arc resonance lamps emitted radiation at 2537 Å, which was absorbed by the mercury vapor in the reaction chamber, producing photo-excited mercury atoms that reacted with the $N_2O$ and $PH_3$ as shown in Equations (7) and (8) discussed above. The atomic oxygen and neutral phosphinyl radical ($.PH_2$) thus formed reacted with the $SiH_4$ to form phosphorus-doped silicon dioxide [Si(P)$O_2$] as shown in Equation (9) discussed above, which deposited as a layer on the silicon wafer. Using a continuous flow photochemical reactor system, with reactant gas flow rates of $SiH_4$, $N_2O$, and $PH_3$ of 2, 60, and 1 sccm, respectively, a phosphorus-doped $SiO_2$ layer was deposited on the substrate at the rate of 200 Å/minute and the phosphorus content of the deposited layer was approximately 5%. In addition, a low pressure static photochemical reactor system was used with reactant gas pressures of $SiH_4$, $N_2O$, and $PH_3$ equivalent to 3, 30, and 1 mm of mercury, respectively. The phosphorus-doped $SiO_2$ layer was deposited at initial rates of 200 Å/minute and the phosphorus-content in the deposited layer was approximately 5%. Using reactant gas pressures of $SiH_4$, $N_2O$, and $PH_3$ equivalent to 2, 30, and 12 mm of mercury, resectively in a static system, levels of phosphorus-doping of 17% in the deposited layer have been achieved.

The refractive index of the photodeposited phosphorus-doped $SiO_2$ layer was dependent on the $N_2O/PH_3$ ratio and indices from 1.55 to 1.65 were measured. The films exhibiting the higher refractive indices indicated a greater phosphorus doping content of the $SiO_2$ dielectric material. The chemical composition of the phosphorus-doped $SiO_2$ films was determined by Auger electron spectroscopy and the phosphorus content was confirmed by energy dispensive X-ray analysis (EDAX). The etch rate in "P-etch" [i.e., a mixture of 60 milliliters (ml) of water, 3 ml of 49% HF, and 2 ml of 70% $HNO_3$] of the phosphorus-doped $SiO_2$ films was significantly faster than that of pure $SiO_2$, yielding values of 200 Å/second, which concur with values of phosphorus-doped films produced by known chemical vapor deposition techniques previously discussed. The amount of dopant contained in the dielectric layer deposited by the above-described process may be controlled by adjusting the amount of dopant-containing precursor which is added to the reactant gas mixture.

Although phosphorus-doped $SiO_2$ layers were formed as described above, it is also possible to form phosphorus-doped SiO layers by this process embodiment of the present invention by increasing the ratio of $SiH_4$ to $N_2O$ in a manner similar to that described in Example 1.

The photochemically deposited phosphorus-doped $SiO_2$ films formed by the above-described process of the present invention have application as dielectric layers for the passivation of charge-sensitive microelectronic devices, such as silicon MOS devices. In addition, these phosphorus-doped films may be used as a counter-diffusion layer on GaAs devices for the minimization of outdiffusion of both gallium (Ga) and arsenic (As) at temperatures exceeding 100° C.

EXAMPLE 3

This example illustrates the use of the process in accordance with the third embodiment of the present invention as previously described herein.

Using the apparatus shown in FIG. 2 with two reactant gas chambers, a layer of $SiO_2$ was deposited on the surface of a wafer of silicon having a two-inch diameter. The general procedure described in relation to Example 1 above was followed, except that mercury sensitization was not used. A continuous flow photochemical reactor system was used. The oxygen-containing precursor was $N_2O$ and the selected vapor phase reactant was $SiH_4$. Radiation having a wavelength of 1849 Å was used to dissociate the $N_2O$; and the window of the reaction chamber was formed of spectrosil (a trademark of Thermal American Fused Quartz, Montville, N.J.), which was transparent to 1849 Å radiation. Low pressure mercury arc lamps designed with spectrosil envelopes emitted radiation at 1849 Å, which was transmitted through the spectrosil window into the reaction chamber. The radiation was absorbed by the $N_2O$ and caused dissociation thereof to produce atomic oxygen. The atomic oxygen then reacted with the $SiH_4$ to produce the desired $SiO_2$ which deposited as a layer on the silicon wafer. Reactant gas flow rates of $SiH_4$ and $N_2O$ of 2 sccm and 60 sccm and an operating pressure of 3.7 Torr were used. The $SiO_2$ layer was deposited at the rate of 700 Å in 30 minutes, and even higher rates may be achieved with process optimization.

The refractive index of the photodeposited $SiO_2$ layer formed by the above-described process of the present invention was determined by ellipsometry and the films were found to have a refractive index characteristic of $SiO_2$, i.e. 1.45. The etch rate characteristics of the photodeposited $SiO_2$ material in buffered HF were comparable to those of $SiO_2$ films deposited by low temperature plasma techniques.

Although $SiO_2$ layers were formed as described above, it is also possible to form SiO layers by this process embodiment of the present invention by increasing the ratio of $SiH_4$ to $N_2O$ in a manner similar to that described in Example 1.

The photochemically deposited $SiO_2$ layers formed by the above-described process of the present invention have application as dielectric layers for the passivation of semiconductor devices, particularly charge sensitive microelectronic devices, such as MOS devices and GaAs, HgCdTe photoconductive and photovoltaic devices, field-effect transistors. In addition, the oxide layers formed by the above-described process may be used on electrooptical materials such as lenses and mirrors or on solar cells as described in relation to Example 1.

Using the above-described process, $SiO_2$ layers were similarly deposited on Ge, InSb, and Al substrates.

Furthermore, using the general process described above, a layer of $SiO_2$ was deposited on the surface of a silicon wafer, using molecular oxygen ($O_2$) as the oxygen-containing precursor. In order to completely inhibit the spontaneous thermal oxidation reaction of $O_2$ and $SiH_4$, a nitrogen gas diluent was used and the pressure and flow rate conditions of the reactant gases were carefully controlled. Using an operating pressure of 0–5 Torr and reactant gas flow rates of $SiH_4$, $O_2$, and $N_2$ of 1, 20, and 80 sccm, respectively a layer of $SiO_2$ was deposited at the rate of 3000 to 4000 Å in 30 minutes. Thus, it may be seen that the use of molecular oxygen as the oxygen-containing precursor in practicing the present invention greatly enhances the oxide deposition rate.

EXAMPLE 4

This example illustrates the use of the process in accordance with the fourth embodiment of the present invention as previously described herein.

Using the apparatus described and illustrated in relation to FIG. 2 with three reactant gas chambers, a phosphorus-doped $SiO_2$ layer was deposited on the surface of a silicon wafer having a two-inch diameter. The general procedure described in relation to Example 3 above was followed, with the addition of a third reactant gas. A continuous flow photochemical reactor system was used. Nitrous oxide was used as the oxygen-containing precursor, silane was the selected vapor phase reactant, and phosphine was the dopant-containing precursor. Radiation having a wavelength of 1849 Å was used to dissociate the $N_2O$ and the window of the reaction chamber was formed of spectrosil as discussed in relation to Example 3. The 1849 Å in radiation was absorbed by the $N_2O$ and caused dissociation thereof to produce atomic oxygen. The atomic oxygen then reacted with the $SiH_4$ and $PH_3$ as shown in Equation (18) above, to produce the desired phosphorus-doped $SiO_2$, which deposited as a layer on the silicon wafer. A low pressure continuous flow photochemical reactor system was used with reactant gas flow rates of $SiH_4$, $N_2O$, and $PH_3$ of 2, 60, and 4 sccm, respectively. The $SiO_2$ was deposited at the rate of 330 Å in 30 minutes, and even higher rates may be achieved with process optimization. The phosphorus-content of the deposited layer was approximately 5%.

The refractive index of the photodeposited phosphorus-doped $SiO_2$ layer formed as described above was 1.75. The chemical composition of the deposited film was determined by Auger electron spectroscopy to be the value discussed above. The etch rate in "P-etch" [i.e., a mixture of 60 ml of water, 30 ml of 49% HF, and 2 ml of 70% $HNO_3$] of the phosphorus-doped $SiO_2$ film was determined to be significantly faster than that of pure $SiO_2$, having values comparable to phosphorus-doped films produced by known chemical vapor deposition techniques previously discussed.

The photochemically deposited phosphorus-doped $SiO_2$ films formed by the above-described process of the present invention find utility as discussed in relation to Example 2.

While the present invention has been particularly described with the respect to the preferred embodiments thereof, it will recognized by those skilled in the art that certain modifications in form and detail may be made without departing from the spirit and scope of the invention. In particular, the scope of the invention is not limited to the photochemical vapor deposition of silicon oxides, but is intended to include the photochemical vapor deposition of an oxide of any gas phase reactant that will react with atomic oxygen, such as reactants containing germanium, gallium, boron, indium, aluminum, titanium, tungsten and hafnium. In addition, the chemically unreactive oxygen-containing precursor is not limited to nitrous oxide, molecular oxygen, or nitrogen dioxide, but is intended to include any material which will photochemically dissociate to atomic oxygen, either with or without mercury sensitization. Further, the substrate on which oxide deposition may be performed by the process of the present invention is not limited to silicon, which was used merely as an example, but may include other semiconductor substrate materials, such as GaAs, HgCdTe, or InSb, or electro-optical materials, such as lenses or mirrors, or GaAs or Si solar cells. Finally, the scope of the invention is not limited to the use of phosphine to produce phosphorus-doping, but is intended to include any dopant-containing precursor which is capable of mercury photosensitized dissociation to form neutral particles or which is capable of simultaneous oxidation by atomic oxygen with the selected gas reactant. Such precursors include diborane, arsine, stibine, hydrogen selenide, hydrogen sulfide, or hydrogen telluride, to produce boron-, arsenic-, antimony-, selenium-, sulfur-, or tellurium-doping, respectively.

What is claimed is:

1. A process for depositing a layer of an oxide of a chosen material on the surface of a selected substrate by chemical vapor deposition comprising the steps of:
   (a) providing said substrate; and
   (b) exposing said substrate to a selected vapor phase reactant in the presence of photochemically generated neutral oxygen atoms, whereby said oxygen atoms react with said vapor phase reactant to form said oxide which deposits as said layer on said substrate and said neutral oxygen atoms are formed in a manner which avoids damage to said substrate due to charge bombardment or radiation bombardment of said substrate.

2. The process set forth in claim 1 wherein:
   (a) said vapor phase reactant is silane ($SiH_4$); and
   (b) said oxide is silicon dioxide, silicon monoxide, or a mixture thereof.

3. The process set forth in claim 1 wherein said vapor phase reactant contains an element selected from the group consisting of silicon, germanium, gallium, boron, indium, aluminum, titanium, tungsten, and hafnium.

4. The process set forth in claim 1 wherein said exposing further includes being performed in the presence of photochemically generated neutral dopant atoms or particles and said oxide incorporates said dopant atoms.

5. The process set forth in claim 1 wherein said exposing further includes being performed in the presence of a precursor containing selected dopant atoms and said oxide incorporates said dopant atoms.

6. A process for depositing a layer of an oxide of a chosen material on the surface of a selected substrate by chemical vapor deposition comprising the steps of:
   (a) providing said substrate; and
   (b) exposing said substrate to a selected vapor phase reactant in the presence of photochemically generated neutral oxygen atoms, said neutral oxygen atoms being formed by the mercury photosensitized dissociation of a chosen chemically unreactive oxygen-containing precursor, whereby said neutral oxygen atoms react with said vapor phase reactant to form said oxide which deposits as said layer on said substrate and said neutral oxygen atoms are formed in a manner which avoids damage to said substrate due to charge bombardment or radiation bombardment of said substrate.

7. The process set forth in claim 6 wherein said chemically unreactive oxygen-containing precursor is selected from the group consisting of: nitrous oxide; nitrogen dioxide; and molecular oxygen under selected pressure and flow rate conditions.

8. The process set forth in claim 6 wherein:
   (a) said chemically unreactive oxygen-containing precursor is nitrous oxide ($N_2O$);
   (b) said vapor phase reactant is silane ($SiH_4$);
   (c) said exposing is performed in a static photochemical reactor system;
   (d) the reactant gas pressures of said $SiH_4$ and said $N_2O$ are 3 millimeters and 12 millimeters of mercury, respectively and said oxide is silicon monoxide (SiO); and
   (e) the temperature of said process is maintained at a selected temperature within the range of 30° C. to 200° C.

9. The process set forth in claim 6 wherein:
   (a) said chemically unreactive oxygen-containing precursor is nitrous oxide ($N_2O$);
   (b) said vapor phase reactant is silane ($SiH_4$);
   (c) said exposing is performed in a static photochemical reactor system;
   (d) the reactant gas pressures of said $SiH_4$ and said $N_2O$ are 3.0 millimeters and 30 millimeters of mercury, respectively and said oxide is silicon dioxide ($SiO_2$); and
   (e) the temperature of said process is maintained at a selected temperature within the range of 30° C. to 200° C.

10. The process set forth in claim 6 wherein:
    (a) said chemically unreactive oxygen-containing precursor is nitrous oxide ($N_2O$);
    (b) said vapor phase reactant is silane ($SiH_4$);
    (c) said exposing is performed in a continuous flow photochemical reactor system;
    (d) the reactant gas flow rates of said $SiH_4$ and said $N_2O$ are 2 standard cubic centimeters per minute (sccm) and 10 sccm, respectively and said oxide is silicon monoxide (SiO); and
    (e) the temperature of said process is maintained at a selected temperature within the range of 30° C. to 200° C.

11. The process set forth in claim 6 wherein:
    (a) said chemically unreactive oxygen-containing precursor is nitrous oxide ($N_2O$);
    (b) said vapor phase reactant is silane ($SiH_4$);
    (c) said exposing is performed in a continuous flow photochemical reactor system;
    (d) the reactant gas flow rates of said $SiH_4$ and said $N_2O$ are 2 standard cubic centimeters per minute (sccm) and 50 sccm, respectively and said oxide is silicon dioxide ($SiO_2$); and
    (e) the temperature of said process is maintained at a selected temperature within the range of 30° C. to 200° C.

12. A process for depositing a layer of an oxide of a chosen material on the surface of a selected substrate by chemical vapor deposition comprising the steps of:
    (a) providing said substrate; and
    (b) exposing said substrate to a selected vapor phase reactant in the presence of photochemically generated neutral oxygen atoms, said neutral oxygen atoms being formed by exposing a chosen oxygen-containing precursor to radiation of a selected wavelength which causes the direct dissociation of said precursor to form said neutral oxygen atoms, whereby said neutral oxygen atoms react with said vapor phase reactant to form said oxide which deposits as said layer on said substrate, and said neutral oxygen atoms are formed in a manner which avoids damage to said substrate due to charge bombardment or radiation bombardment of said substrate.

13. The process set forth in claim 12 wherein said oxygen-containing precursor is selected from the group consisting of nitrous oxide ($N_2O$); nitrogen dioxide ($NO_2$); and molecular oxygen ($O_2$) under selected pressure and flow rate conditions.

14. The process set forth in claim 12 wherein:
    (a) said oxygen-containing precursor is nitrous oxide ($N_2O$); and
    (b) said selected wavelength is within the range of 1750–1950 Å.

15. The process set forth in claim 14 wherein:
    (a) said vapor phase reactant is silane ($SiH_4$);
    (b) the reactant gas flow rates of said $SiH_4$ and said $N_2O$ are 2 standard cubic centimeters per minute (sccm) and 60 sccm, respectively;
    (c) said oxide is silicon dioxide ($SiO_2$); and
    (d) the temperature of said process is maintained at a selected temperature within the range of 30° C. to 200° C.

16. The process set forth in claim 12 wherein:
    (a) said oxygen-containing precursor is molecular oxygen ($O_2$), and said molecular oxygen has nitrogen ($N_2$) mixed therewith;

(b) said selected wavelength of said radiation is 1849 Å

(c) said vapor phase reactant is silane ($SiH_4$);

(d) said exposing is performed at a pressure within the range of 0-5 Torr; and (e) the reactant gas flow rates of said $SiH_4$, said $O_2$, and said $N_2$ are 1, 20, and 80 standard cubic centimeters per minute, respectively.

17. A process for depositing a layer of a chosen oxide containing a selected dopant material on the surface of a selected substrate by chemical vapor deposition comprising:

(a) providing said substrate;

(b) exposing said substrate to a selected vapor phase reactant in the presence of a selected dopant-containing precursor and in the presence of photochemically generated neutral oxygen atoms, whereby said oxygen atoms react with said vapor phase reactant and said dopant-containing precursor to form said oxide containing said selected dopant material which deposits as said layer on said substrate, and said neutral oxygen atoms are formed from a chosen chemically unreactive oxygen-containing precursor in a manner which avoids damage to said substrate due to charge bombardment or radiation bombardment of said substrate.

18. The process set forth in claim 17 wherein said dopant-containing precursor is selected from the group consisting of phosphine ($PH_3$), diborane ($B_2H_6$), arsine ($AsH_3$), stibine ($SbH_3$), hydrogen selenide ($H_2Se$), hydrogen sulfide ($H_2S$), and hydrogen telluride ($H_2Te$).

19. The process set forth in claim 17 wherein said vapor phase reactant contains an element selected from the group consisting of silicon, germanium, gallium, boron, indium, aluminum, titanium, tungsten, and hafnium.

20. The process set forth in claim 17 wherein:

(a) said oxygen-containing precursor is nitrous oxide ($N_2O$);

(b) said dopant-containing precursor is phosphine ($PH_3$);

(c) said vapor phase reactant is silane ($SiH_4$); and (d) said oxide is silicon dioxide ($SiO_2$) doped with phosphorus (P).

21. A process for depositing a layer of a chosen oxide containing a selected dopant material on the surface of a selected substrate by chemical vapor deposition comprising the steps of:

(a) providing said substrate; and (b) exposing said substrate to a selected vapor phase reactant in the presence of neutral oxygen atoms and neutral atoms or particles of said dopant material, said oxygen atoms and said atoms or particles of said dopant material being simultaneously generated by a mercury-photosensitized photochemical process, whereby said neutral oxygen atoms and said neutral atoms or particles of said dopant material react with said vapor phase reactant to form said oxide containing said selected dopant material which deposits as said layer on said substrate, and said neutral oxygen atoms and said neutral atoms of said dopant material are formed in a manner which avoids damage to said substrate due to charge bombardment or radiation bombardment of said substrate.

22. The process set forth in claim 21 wherein:

(a) said neutral oxygen atoms are formed by the mercury photosensitized dissociation of a chosen chemically unreactive oxygen-containing precursor; and (b) said neutral atoms or particles of said dopant material are formed by the mercury photosensitized dissociation of a selected dopant-containing precursor.

23. The process set forth in claim 22 wherein said oxygen-containing precursor is selected from the group consisting of: nitrous oxide ($N_2O$); nitrogen dioxide ($NO_2$); and molecular oxygen ($O_2$) under selected pressure and flow rate conditions.

24. A process for depositing a layer of chosen oxide containing a selected dopant material on the surface of a selected substrate by chemical vapor deposition comprising:

(a) providing said substrate;

(b) exposing said substrate to a selected vapor phase reactant in the presence of a selected dopant-containing precursor and neutral oxygen atoms, said neutral oxygen atoms being formed by exposing a chosen chemically unreactive oxygen-containing precursor to radiation of a selected wavelength to cause the direct dissociation of said oxygen-containing precursor to form said neutral oxygen atoms, whereby said neutral oxygen atoms react with said vapor phase reactant and said dopant-containing precursor to form said oxide containing said selected dopant material which deposits as said layer on said substrate, and said neutral oxygen atoms are formed in a manner which avoids damage to said substrate due to charge bombardment or radiation bombardment of said substrate.

25. The process set forth in claim 24 wherein said oxygen-containing precursor is selected from the group consisting of: nitrous oxide ($N_2O$); nitrogen dioxide ($NO_2$); and molecular oxygen ($O_2$) under selected pressure and flow rate conditions.

26. The process set forth in claim 24 which includes the direct dissociation of said dopant-containing precursor by exposure to said radiation of said selected wavelength, to form a neutral particle of said dopant-containing precursor which reacts with said neutral oxygen atoms and and said vapor phase reactant.

27. A process for depositing a layer of a chosen oxide on a selected substrate while simultaneously minimizing damage to said substrate due to charge bombardment or radiation bombardment of said substrate, which comprises:

(a) passing a selected vapor phase reactant over a surface of said substrate;

(b) photochemically generating neutral oxygen atoms in the presence of said vapor phase reactant; and (c) reacting said neutral oxygen atoms with said vapor phase reactant to form said chosen oxide, whereby said oxide deposits as said layer on said substrate and said neutral oxygen atoms are formed in a manner which avoids damage to said substrate due to said charge bombardment or said radiation bombardment of said substrate.

28. The process defined in claim 27 wherein the photochemical generation of said neutral oxygen atoms includes either the mercury-photosensitized dissociation of a selected oxygen-containing precursor in the presence of said vapor phase reactant or the direct impingement of said precursor with radiation of a selected wavelength sufficient to cause the direct dissociation of said precursor to form said neutral oxygen atoms.

29. The process defined in claim 27 wherein said reacting of said neutral oxygen atoms with said vapor phase reactant includes being performed in the presence of a precursor containing selected dopant atoms, and said oxide incorporates said dopant atoms.

30. A low-temperature, charge-free process for depositing a layer of an oxide of a chosen material on the surface of a selected substrate while simultaneously avoiding damage to said substrate comprising exposing said substrate to a selected vapor phase reactant in the presence of neutral, charge-free oxygen atoms formed in a manner which avoids the generation of charged particles or high energy radiation, to bring about the reaction of said oxygen atoms with said vapor phase reactant to form said oxide which deposits as said layer on said substrate, while simultaneously avoiding said damage to said substrate due to said charged particles or said high energy radiation.

31. A process for depositing an oxide layer of a chosen material on the surface of a selected substrate which comprises: exposing said surface to a selected vapor phase reactant in the presence of neutral, charge-free oxygen atoms and thereby reacting said oxygen atoms with said reactant in a manner sufficient to form said oxide on said surface of said substrate.

32. The process set forth in claim 31 wherein said neutral, charge-free oxygen atoms are formed by mercury photosensitized dissociation of a chosen chemically unreactive oxygen-containing precursor.

33. The process set forth in claim 31 wherein said neutral, charge-free oxygen atoms are formed by exposing a chosen oxygen-containing precursor to radiation of a selected wavelength to cause the direct dissociation of said precursor to form said oxygen atoms.

34. The process set forth in claim 31 wherein said reaction occurs at a temperature in the range of 30° C. to 300° C.

35. A process for depositing a layer of a chosen oxide containing a selected dopant material on the surface of a selected substrate which comprises exposing said surface to a selected vapor phase reactant in the presence of a selected dopant-containing precursor and in the presence of neutral, charge-free oxygen atoms and thereby reacting said oxygen atoms with said vapor phase reactant and said dopant-containing precursor in a manner sufficient to form said oxide containing said dopant material, which deposits as said layer on said surface of said substrate.

36. An article of manufacture comprising a chosen substrate having a layer of a selected oxide formed on the surface of said substrate, wherein said layer of said oxide is formed by the process of claim 31.

37. The article set forth in claim 36 wherein said substrate is selected from the group consisting of a semiconductor material and a metal.

38. A semiconductor device comprising a substrate of a chosen semiconductor material and a layer of a selected oxide formed on the surface of said substrate characterized in that said layer of said oxide is formed by the process of claim 37 whereby damage to said substrate during the formation of said layer of said oxide is minimized.

39. The semiconductor device set forth in claim 38 which further comprises a gate structure formed on the surface of said layer of said oxide wherein said layer of said oxide provides an insulating layer between said substrate and said gate structure.

* * * * *